(12) United States Patent
Lee et al.

(10) Patent No.: US 12,376,351 B2
(45) Date of Patent: *Jul. 29, 2025

(54) SELF-ALIGNED CONTACT AIR GAP FORMATION

(71) Applicant: Taiwan Semiconductor Manufacturing Co., Ltd., Hsinchu (TW)

(72) Inventors: Kai-Hsuan Lee, Hsinchu (TW); Bo-Yu Lai, Taipei (TW); Sai-Hooi Yeong, Hsinchu County (TW); Feng-Cheng Yang, Hsinchu County (TW); Yih-Ann Lin, Hsinchu County (TW); Yen-Ming Chen, Hsin-Chu County (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/439,095

(22) Filed: Feb. 12, 2024

(65) Prior Publication Data

US 2024/0186372 A1 Jun. 6, 2024

Related U.S. Application Data

(60) Continuation of application No. 17/175,831, filed on Feb. 15, 2021, now Pat. No. 11,901,408, which is a
(Continued)

(51) Int. Cl.
*H10D 62/10* (2025.01)
*H01L 21/764* (2006.01)
(Continued)

(52) U.S. Cl.
CPC ......... *H10D 62/115* (2025.01); *H01L 21/764* (2013.01); *H01L 21/7682* (2013.01);
(Continued)

(58) Field of Classification Search
CPC ........... H01L 29/0649; H01L 29/66545; H01L 29/6656; H01L 29/6681
See application file for complete search history.

(56) References Cited

U.S. PATENT DOCUMENTS 6,492,245 B1 12/2002 Liu
7,732,346 B2 6/2010 Hsu et al.
(Continued)

FOREIGN PATENT DOCUMENTS

CN 108231664 A 6/2018
DE 102017113681 A1 6/2018
TW 468249 B 12/2001

*Primary Examiner* — Samuel A Gebremariam
(74) *Attorney, Agent, or Firm* — HAYNES AND BOONE, LLP

(57) ABSTRACT

In one example aspect, a method for integrated circuit (IC) fabrication comprises providing a device structure including a substrate, a source/drain (S/D) feature on the substrate, a gate stack on the substrate, a contact hole over the S/D feature; and a dummy feature over the S/D feature and between the gate stack and the contact hole. The method further comprises forming in the contact hole a contact plug that is electrically coupled to the S/D feature, and, after forming the contact plug, selectively removing the dummy feature to form an air gap that extends higher than a top surface of the gate stack. The method further comprises forming over the contact plug a seal layer that covers the air gap.

20 Claims, 12 Drawing Sheets

Related U.S. Application Data division of application No. 16/144,642, filed on Sep. 27, 2018, now Pat. No. 10,923,565.

(51) Int. Cl.
 *H01L 21/768* (2006.01)
 *H01L 23/10* (2006.01)
 *H10D 30/01* (2025.01)
 *H10D 64/01* (2025.01)
 *H10D 84/01* (2025.01)
 *H10D 84/03* (2025.01)

(52) U.S. Cl.
 CPC .. *H01L 21/76841* (2013.01); *H01L 21/76897* (2013.01); *H01L 23/10* (2013.01); *H10D 30/0243* (2025.01); *H10D 64/017* (2025.01); *H10D 64/021* (2025.01); *H10D 84/0184* (2025.01); *H10D 84/0186* (2025.01); *H10D 84/038* (2025.01)

(56) References Cited

U.S. PATENT DOCUMENTS

| | | | |
|---|---|---|---|
| 8,048,733 B2 | 11/2011 | Yeh et al. |
| 8,361,855 B2 | 1/2013 | Yeh et al. |
| 8,415,254 B2 | 4/2013 | Yeh et al. |
| 8,487,378 B2 | 7/2013 | Goto et al. |
| 8,586,436 B2 | 11/2013 | Ng et al. |
| 8,729,634 B2 | 5/2014 | Shen et al. |
| 8,796,666 B1 | 8/2014 | Huang et al. |
| 8,822,243 B2 | 9/2014 | Yan et al. |
| 8,826,213 B1 | 9/2014 | Ho et al. |
| 8,887,106 B2 | 11/2014 | Ho et al. |
| 8,943,455 B2 | 1/2015 | Chen et al. |
| 8,987,142 B2 | 3/2015 | Lee et al. |
| 9,093,530 B2 | 4/2015 | Huang et al. |
| 9,053,279 B2 | 6/2015 | Chang et al. |
| 9,099,530 B2 | 8/2015 | Lin et al. |
| 9,153,478 B2 | 10/2015 | Liu et al. |
| 9,337,192 B2 | 5/2016 | JangJian et al. |
| 9,431,304 B2 | 8/2016 | Huang et al. |
| 9,461,144 B2 | 10/2016 | Yeh et al. |
| 9,501,601 B2 | 11/2016 | Chang et al. |
| 9,548,303 B2 | 1/2017 | Lee et al. |
| 9,608,065 B1 | 3/2017 | Bergendahl |
| 9,716,158 B1 | 7/2017 | Cheng et al. |
| 9,761,684 B2 | 9/2017 | Huang et al. |
| 9,876,114 B2 | 1/2018 | Huang |
| 11,901,408 B2 * | 2/2024 | Lee ................ H01L 21/823468 |
| 2012/0098070 A1 | 4/2012 | Wang |
| 2012/0104512 A1 | 5/2012 | Horak et al. |
| 2013/0075831 A1 | 3/2013 | JangJian et al. |
| 2013/0248950 A1 | 9/2013 | Kang et al. |
| 2014/0282326 A1 | 9/2014 | Chen et al. |
| 2015/0126013 A1 | 5/2015 | Hwang |
| 2015/0243544 A1 | 8/2015 | Alptekin et al. |
| 2015/0263122 A1 | 9/2015 | Hsiao et al. |
| 2015/0364573 A1 | 12/2015 | Yeh et al. |
| 2016/0099150 A1 | 4/2016 | Tsai et al. |
| 2016/0365426 A1 | 12/2016 | Ching et al. |
| 2018/0033866 A1 | 2/2018 | Liao |
| 2018/0096990 A1 | 4/2018 | Bi |
| 2018/0097059 A1 | 4/2018 | Bi |
| 2018/0145149 A1 | 5/2018 | Chiang et al. |
| 2020/0105867 A1 | 4/2020 | Lee et al. |
| 2021/0183996 A1 | 6/2021 | Lee et al. |

\* cited by examiner

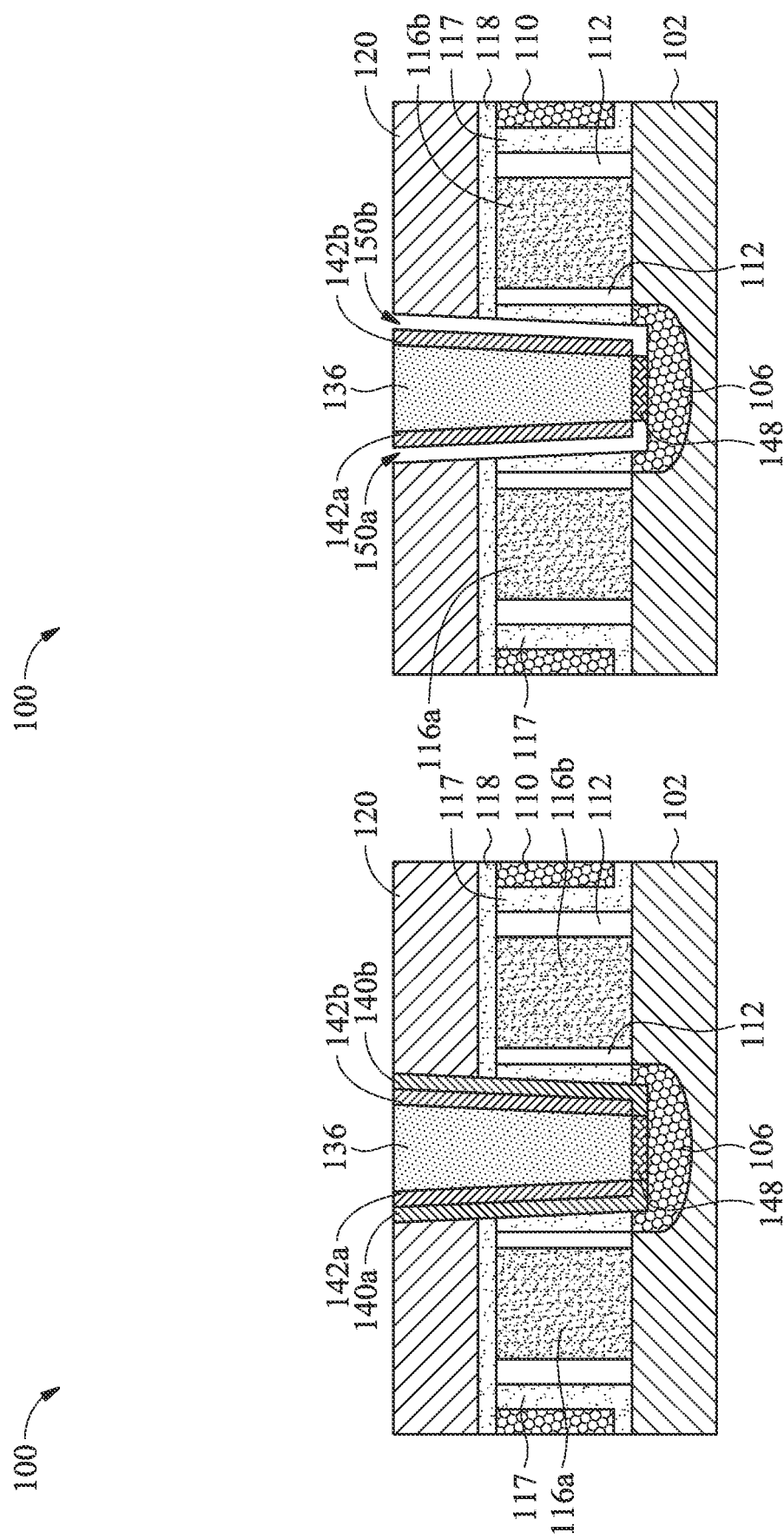

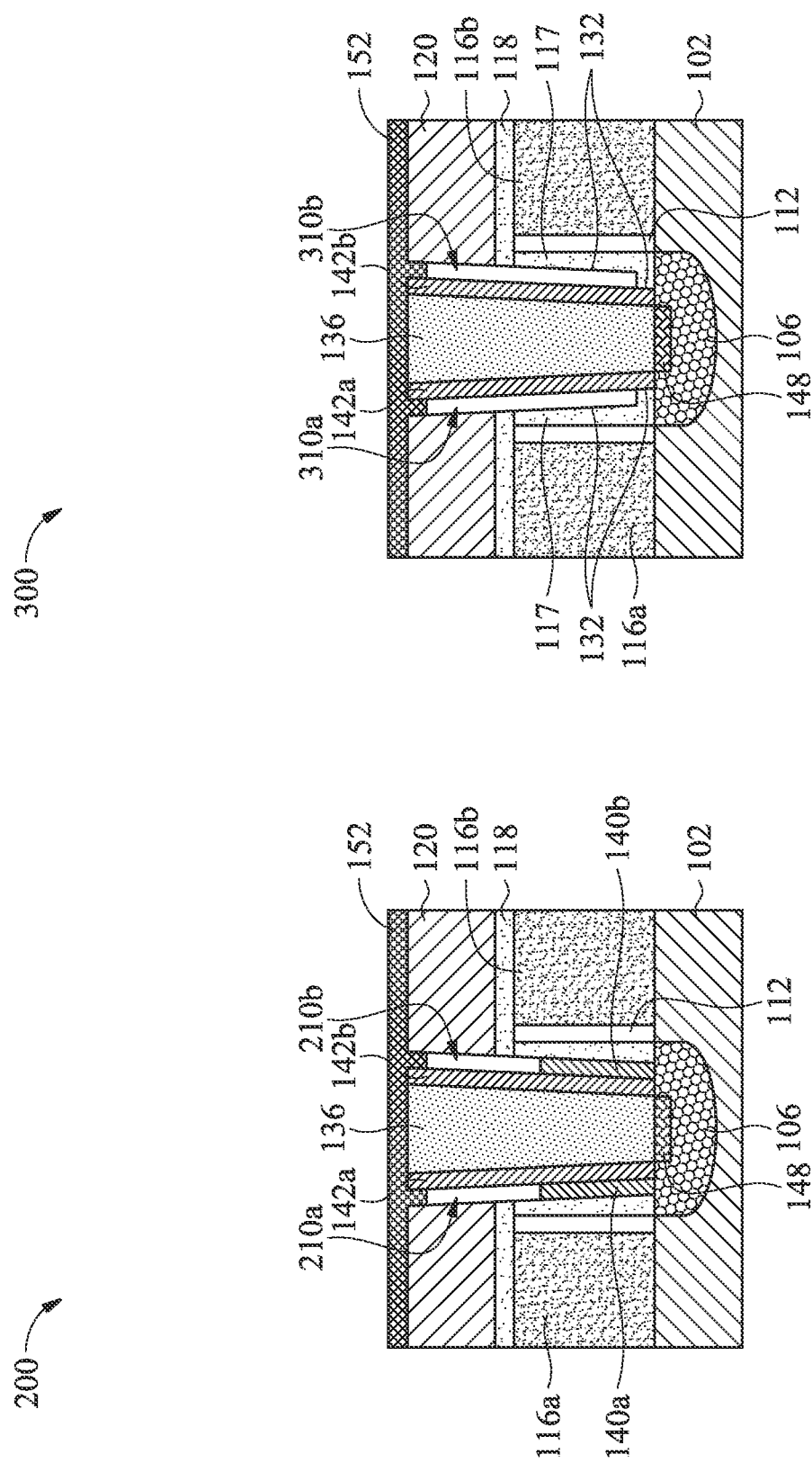

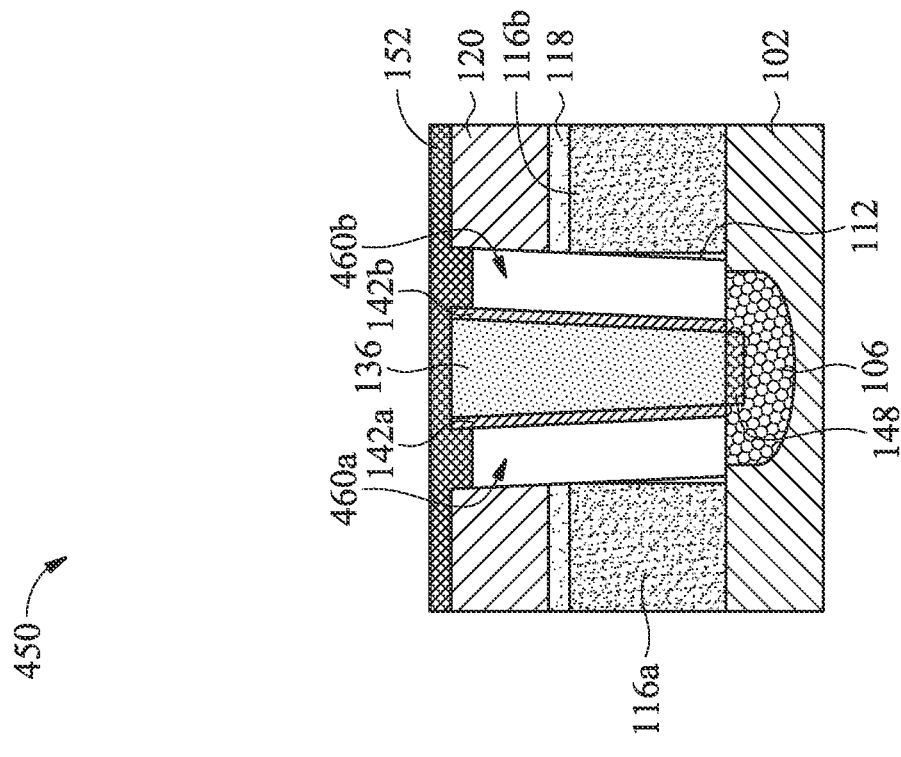
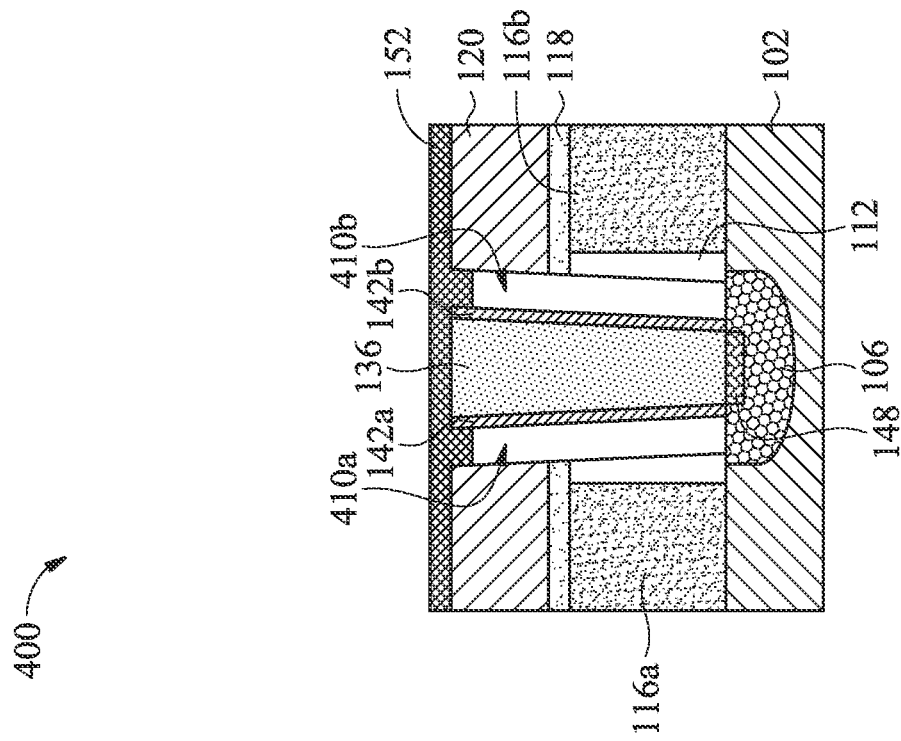
FIG. 4A
FIG. 4B

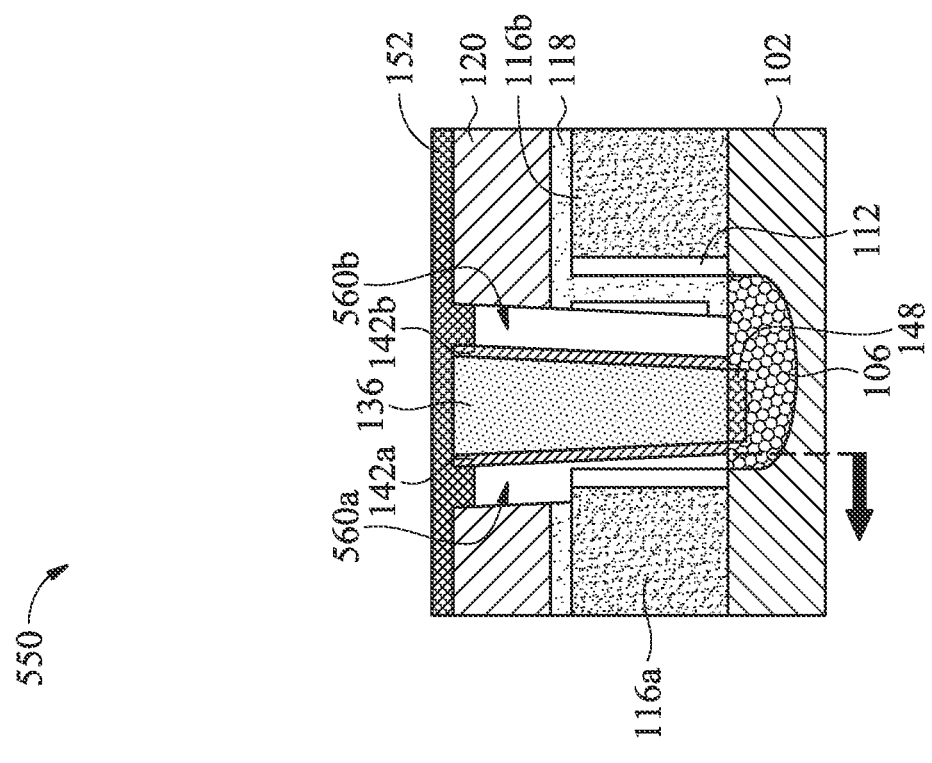
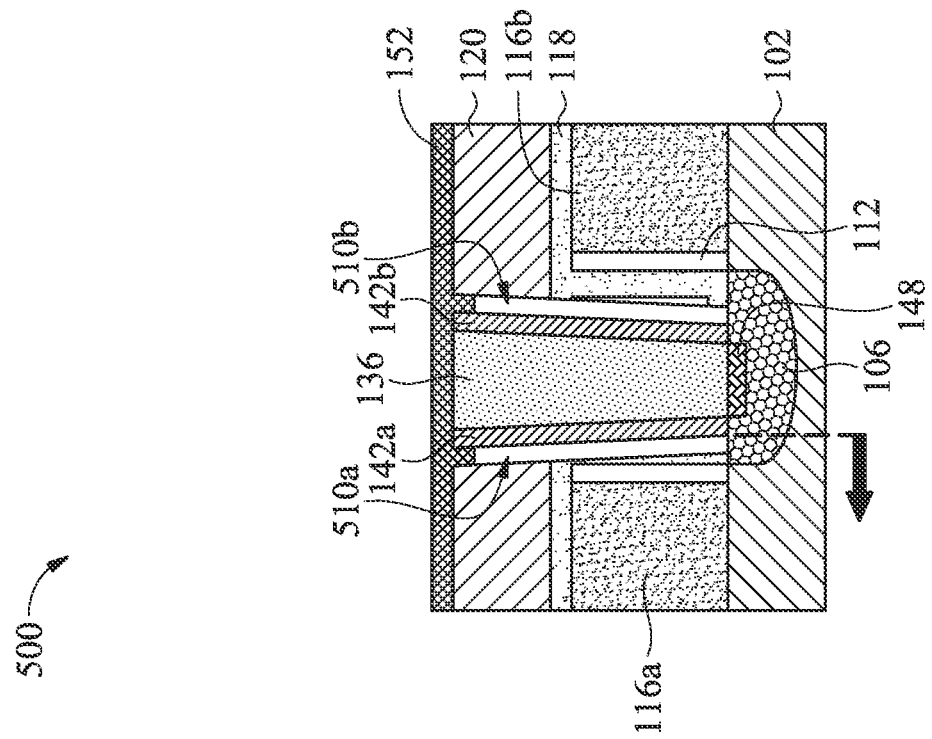
FIG. 5A
FIG. 5B

SELF-ALIGNED CONTACT AIR GAP FORMATION

PRIORITY DATA

The present application is a continuation application of U.S. application Ser. No. 17/175,831, filed Feb. 15, 2021, which is a divisional application of U.S. application Ser. No. 16/144,642, filed Sep. 27, 2018, each of which is hereby incorporated by reference in its entirety.

BACKGROUND

The semiconductor integrated circuit (IC) industry has experienced rapid growth. Technological advances in IC materials and design have produced generations of IC devices where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. But these advances have also increased the complexity of processing and manufacturing IC devices.

For example, as device geometry shrinks, coupling capacitance tends to increase between interconnects such as source/drain (S/D) contact plugs and nearby gates. The increased coupling capacitance degrades device performance. To lower coupling capacitance, insulating materials with a relatively low dielectric constant (k), such as low-k dielectrics and air gaps, have been used between S/D features and nearby gates. But these materials have proven difficult to fabricate. In some instances, low-k dielectric materials are brittle, unstable, difficult to deposit, or sensitive to processes such as etching, annealing, and polishing, and air gap formations are difficult to control. For these reasons and others, it is desirable to improve the fabrication techniques of dielectrics between interconnects in order to reduce the coupling capacitance while maintaining a high overall transistor density in IC.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 2A, 2B, 2C, 2D, 2E, 2F, 2G, 2H, 2I, and 2J are schematic diagrams illustrating cross-sectional views of an IC device during various fabrication stages, according to various embodiments of the present disclosure.

FIGS. 3A, 3B, and 3C are schematic diagrams illustrating the capability of vertical depth control of air gaps, according to various embodiments of the present disclosure.

FIGS. 4A and 4B are schematic diagrams illustrating the capability of lateral width control of air gaps, according to various embodiments of the present disclosure.

FIGS. 5A, 5B, and 5C are schematic diagrams illustrating overlay shift adaptability of air gaps, according to various embodiments of the present disclosure.

DETAILED DESCRIPTION

Figure 1:
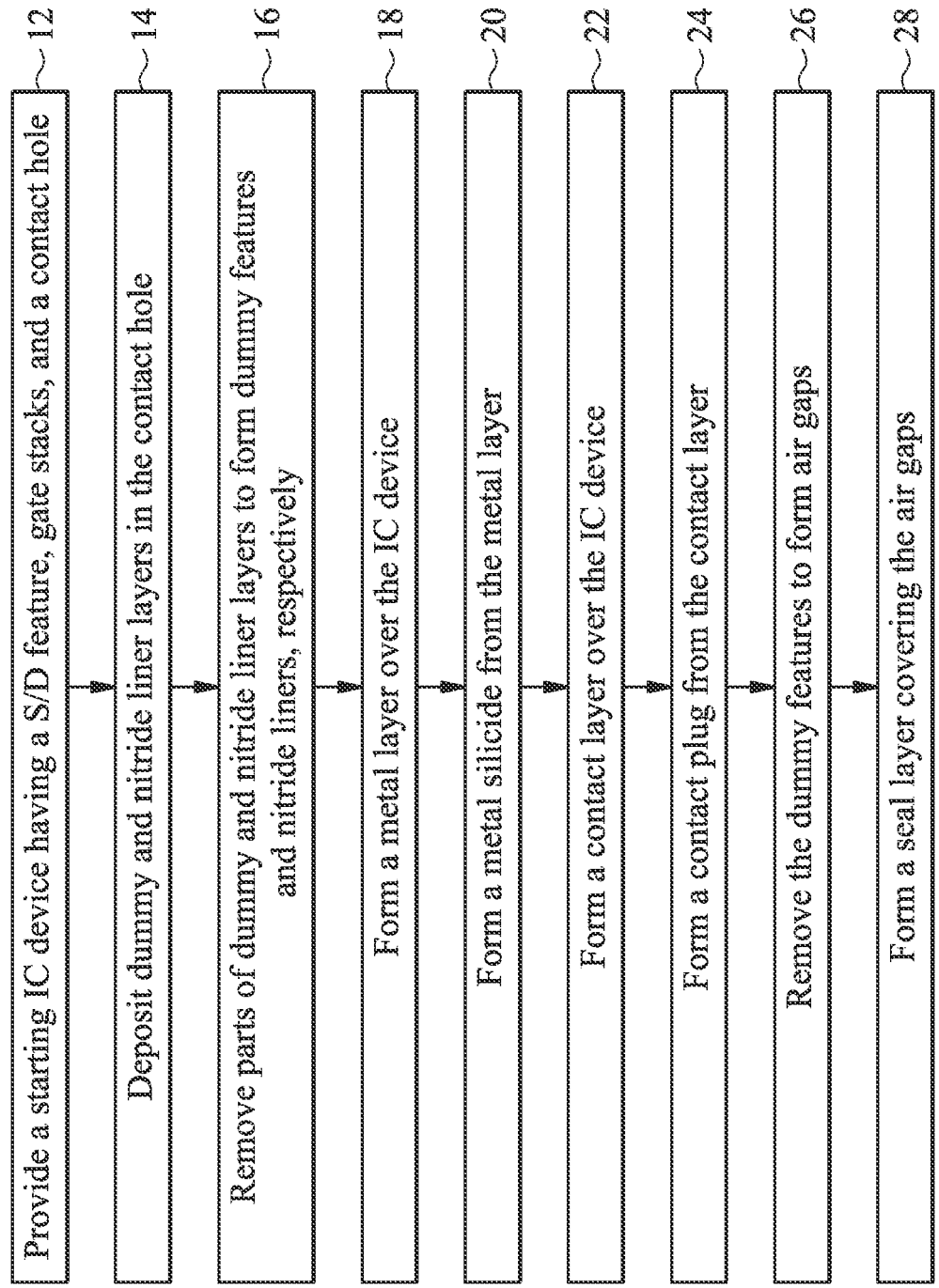
FIG. 1 is a flow chart showing a method for forming an IC device, according to various embodiments of the present disclosure.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the sake of simplicity and clarity and does not in itself dictate a relationship between the various embodiments and/or configurations discussed. Moreover, various features may be arbitrarily drawn in different scales for the sake of simplicity and clarity.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. For example, if the device in the figures is turned over, elements described as being "below" or "beneath" other elements or features would then be oriented "above" the other elements or features. Thus, the exemplary term "below" can encompass both an orientation of above and below. The apparatus may be otherwise oriented (rotated 90 degrees or at other orientations) and the spatially relative descriptors used herein may likewise be interpreted accordingly.

The present disclosure is generally related to IC devices and fabrication methods, and more particularly to the formation of air gaps between source/drain (S/D) contact plugs and nearby metal gates. As FinFET technologies progress towards smaller technology nodes (such as 16 nm, 10 nm, 7 nm, 5 nm, and below), decreasing fin pitch is placing significant constraints on materials that can be used between metal gates and neighboring contact plugs that are connected to S/D features. To minimize coupling capacitance between the metal gates and contact plugs, air gaps can help reduce coupling capacitance because air has lower dielectric constant (k=1) than other dielectric materials. But, when air gaps are formed before contact plugs, the air gaps are prone to be damaged by the subsequent formation of the contact plugs. For example, when forming a contact plug, overlay shift may occur if a mask for patterning the contact plug is not aligned perfectly with lower layer components. With overlay shift, the position of a contact hole may be very close to, if not touching, a neighboring metal gate. In this case, etching the contact hole would expose an already-sealed air gap, and the exposed air gap may be partially or completely filled by a nitride liner, which is formed after the etching of the contact hole. The air gap then loses its purpose of reducing couple capacitance.

The present disclosure avoids such issues by forming air gaps after (not before or simultaneous with) the formation of contact plugs. For example, air gaps are formed by selectively removing dummy features, which are disposed next to contact plugs. Selective removal of the dummy features is realized by etch selectivity of dummy feature material(s) compared to other materials in direct contact with the dummy features. The post-plug formation of air gaps disclosed herein leads to self-aligned air gaps because their locations are determined by the locations of dummy features. Further, such air gaps have precisely controllable profiles. The height of air gaps extends above top surfaces of metal gates. As a result, coupling capacitance between metal stacks and contact plugs can be effectively reduced. Device reliability is improved, and optimal AC/DC gain may be achieved without potential air gap damages.

FIG. 1 is a flow chart of method 10 for fabricating an IC device (or device structure) according to various aspects of the present disclosure. Method 10 is merely an example, and is not intended to limit the present disclosure beyond what is explicitly recited in the claims. Additional operations can be provided before, during, and after method 10, and some operations described can be replaced, eliminated, or moved around for additional embodiments of method 10. In the following discussion, method 10 is described with reference to FIGS. 2A-2J, which are fragmentary diagrammatic cross-sectional views of an IC device 100, in portion or entirety, at various fabrication stages according to various embodiments of the present disclosure.

IC device 100 may be or include a FinFET device (a fin-based transistor), which can be included in a microprocessor, memory cell, and/or other IC device. IC device 100 may be an intermediate device fabricated during processing of an IC chip, a system on chip (SoC), or portion thereof, that includes various passive and active microelectronic devices such as resistors, capacitors, inductors, diodes, p-type field effect transistors (PFETs), n-type field effect transistors (NFETs), metal-oxide semiconductor field effect transistors (MOSFETs), complementary metal-oxide semiconductor (CMOSs) transistors, bipolar transistors, high voltage transistors, high frequency transistors, other suitable components, or combinations thereof. FIGS. 2A-2J have been simplified for the sake of clarity to better understand the inventive concepts of the present disclosure. Additional features can be added in IC device 100, and some of the features described below can be replaced, modified, or eliminated in other embodiments of IC device 100.

Figures 2A, 2B:
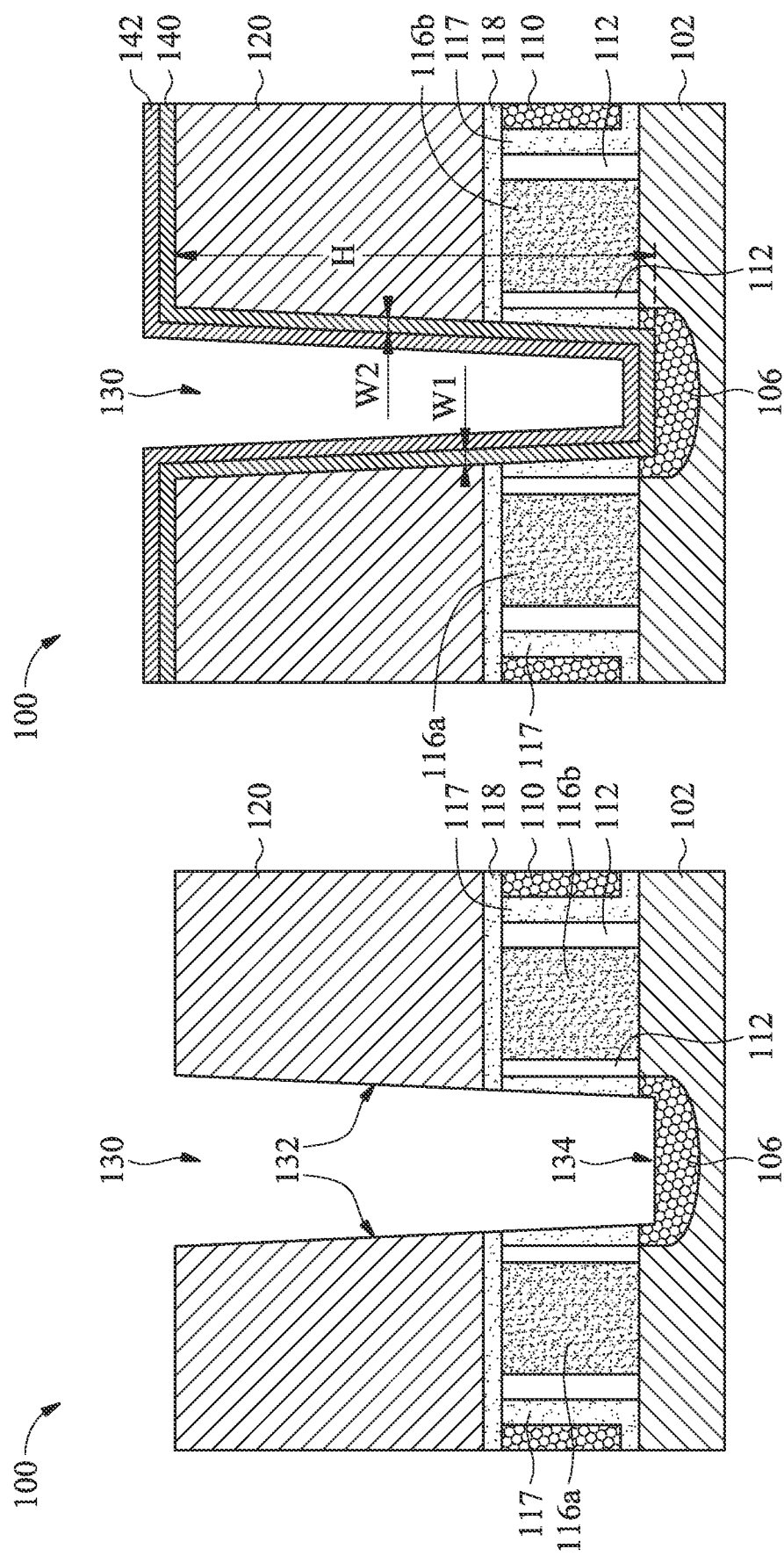

At operation 12, method 10 provides, or is provided with, a starting IC device 100. As shown in FIG. 2A, the starting IC device 100 includes a substrate 102, a source or drain (S/D) feature 106, an ILD layer 110, gate spacers 112, gate stacks 116a and 116b, an etch stop layer (ESL) 117, a contact etch stop layer (CESL) 118, an ILD layer 120, as well as a contact hole 130, which are formed across multiple layers of the IC device 100. IC device 100 may include various other features not shown in FIG. 2A. IC device 100's components are described below.

Substrate 102 is a semiconductor substrate (e.g., a silicon wafer) in the present embodiment. Alternatively, substrate 102 may comprise another elementary semiconductor, such as germanium; a compound semiconductor including silicon carbide, gallium nitride, gallium arsenide, gallium phosphide, indium phosphide, indium arsenide, and indium antimonide; an alloy semiconductor including silicon germanium (SiGe), gallium arsenide phosphide, aluminum indium phosphide, aluminum gallium arsenide, gallium indium arsenide, gallium indium phosphide, and gallium indium arsenide phosphide; or combinations thereof. Substrate 102 may be a semiconductor-on-insulator substrate, such as a silicon-on-insulator (SOI) substrate, a silicon germanium-on-insulator (SGOI) substrate, or a germanium-on-insulator (GOI) substrate. Semiconductor-on-insulator substrates can be fabricated using separation by implantation of oxygen (SIMOX), wafer bonding, and/or other suitable methods. Substrate 102 can include various doped regions (not shown) depending on design requirements of IC device 100. In some implementations, substrate 102 includes p-type doped regions (for example, p-type wells) doped with p-type dopants, such as boron, indium, other p-type dopant, or combinations thereof. In some implementations, substrate 102 includes n-type doped regions (for example, n-type wells) doped with n-type dopants, such as phosphorus, arsenic, other n-type dopant, or combinations thereof. In some implementations, substrate 102 includes doped regions formed with a combination of p-type dopants and n-type dopants. The various doped regions can be formed directly on and/or in substrate 102, for example, providing a p-well structure, an n-well structure, a dual-well structure, a raised structure, or combinations thereof. An ion implantation process, a diffusion process, and/or other suitable doping process can be performed to form the various doped regions in substrate 102.

S/D feature 106 is disposed in substrate 102 and may include n-type doped silicon for NFETs, p-type doped silicon germanium for PFETs, or other suitable materials. S/D feature 106 may be formed by etching depressions in an active region adjacent to gate spacers 112, and then epitaxially growing semiconductor materials in the depressions. The epitaxially grown semiconductor materials may be doped with proper dopants in-situ or ex-situ. S/D feature 106 may have any suitable shape and may be wholly or partially embedded in the active region. For example, depending on the amount of epitaxial growth, S/D feature 106 may rise above, at, or below the top surface of a fin.

ILD layer 110 is disposed on substrate 102. ILD layer 110 may comprise tetraethylorthosilicate (TEOS) oxide, undoped silicate glass, or doped silicon oxide such as borophosphosilicate glass (BPSG), fused silica glass (FSG), phosphosilicate glass (PSG), boron doped silicon glass (BSG), and/or other suitable dielectric materials. Each ILD layer may be formed by plasma enhanced chemical vapor deposition (PECVD), flowable CVD (FCVD), or other suitable methods.

Gate stacks 116a and 116b may each include a gate dielectric layer at the bottom and a gate electrode layer disposed on the gate dielectric layer. The gate dielectric layer may include $SiO_2$ or a high-k dielectric material such as hafnium silicon oxide (HfSiO), hafnium oxide ($HfO_2$), alumina ($Al_2O_3$), zirconium oxide ($ZrO_2$), lanthanum oxide ($La_2O_3$), titanium oxide ($TiO_2$), yttrium oxide ($Y_2O_3$), strontium titanate ($SrTiO_3$), or a combination thereof. The gate dielectric layer may be deposited using CVD, physical vapor deposition (PVD), atomic layer deposition (ALD), and/or other suitable methods. The gate electrode layer of gate stack 116a or 116b may include polysilicon and/or one or more metal layers. For example, the gate electrode layer may include work function metal layer(s), conductive barrier layer(s), and metal fill layer(s). The work function metal layer may be a p-type or an n-type work function layer depending on device type. The p-type work function layer may comprise titanium aluminum nitride (TiAlN), titanium nitride (TiN), tantalum nitride (TaN), ruthenium (Ru), molybdenum (Mo), tungsten (W), platinum (Pt), another suitable metal, or combinations thereof. The n-type work function layer may comprise titanium (Ti), aluminum (Al), tantalum carbide (TaC), tantalum carbide nitride (TaCN), tantalum silicon nitride (TaSiN), titanium aluminum nitride (TiAlN), titanium silicon nitride (TiSiN), another suitable metal, or combinations thereof. The metal fill layer may include aluminum (Al), tungsten (W), cobalt (Co), and/or other suitable materials. The gate electrode layer may be deposited using methods such as CVD, PVD, plating, and/or other suitable processes. Gate stack 116a or 116b may further include an interfacial layer under the gate dielectric layer. The interfacial layer may include a dielectric material such as $SiO_2$ or SiON, and may be formed by chemical oxidation, thermal oxidation, ALD, CVD, and/or other suitable methods.

Each gate spacer 112 may be considered as a sidewall of its neighboring gate stack, or alternatively as coupled to its neighboring gate stack. Each gate spacer 112 may be a single layer or multi-layer structure. For example, gate spacer 112 may include a dielectric material, such as silicon oxide, silicon nitride (SiN), silicon oxynitride, other dielectric material, or combination thereof. Gate spacer 112 may be formed by deposition (e.g., CVD or PVD) and etching processes.

Gate stacks 116a and 116b may be formed by any suitable processes such as a gate-first process and a gate-last process. In an example gate-first process, various material layers are deposited and patterned to become gate stacks 116a and 116b before S/D feature 106 is formed. In an example gate-last process (also called a gate replacement process), temporary gate structures (sometimes called "dummy" gates) are formed first. Then, after transistor S/D feature 106 is formed, the temporary gate structures are removed and replaced with gate stacks 116a and 116b. In the embodiment shown in FIG. 2A, gate stack 116a or 116b may be disposed over a channel region of a transistor to function as a gate terminal. Although not shown in this cross-sectional view, a metal plug may be disposed over such a gate stack, for example, to apply an adjustable voltage to the gate stack in order to control a channel region between S/D feature 106 and another S/D feature not shown in FIG. 2A.

ESL 117 is situated adjacent to and surrounding gate spacers 112. ESL 117 may comprise silicon nitride, silicon oxide, silicon oxynitride (SiON), and/or other materials. During fabrication, before forming ILD layer 110 and gate stacks 116a and 116b, ESL 117 is formed over gate spacers 112. ESL 117 may be formed by one or more methods such as PECVD, ALD, and/or other suitable methods. CESL 118 is situated over and surrounding ILD layer 110 and gate stacks 116a and 116b. CESL 118 may comprise silicon nitride, silicon oxide, silicon oxynitride (SiON), and/or other materials. Unlike ESL 117 which is formed before ILD layer 110 and gate stacks 116a and 116b, CESL 118 is formed after ILD layer 110 and gate stacks 116a and 116b. CESL 118 may be formed by one or more methods including PECVD, ALD, and/or other suitable methods.

In some embodiments, ILD layer 120 is formed over CESL 118. ILD layer 120 may include materials such as tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), a low-k dielectric material, and/or other suitable dielectric materials. ILD layer 120 may be formed by FCVD, PECVD, or other suitable methods. ILD layer 120 may have the same or different thicknesses as ILD layer 110.

Contact hole 130 is situated between gate stacks 116a and 116b. Contact hole 130 penetrates, from top to bottom, ILD layer 120, CESL 118, ILD layer 110. As shown in FIG. 2A, contact hole 130 exposes a top portion of S/D feature 106.

Contact hole 130 comprises a sidewall surface 132 and a bottom surface 134, where bottom surface 134 is effectively the same as the top surface of S/D feature 106. Method 10 then forms a contact plug 136 in contact hole 130. This involves a variety of processes, as discussed below.

At operation 14, method 10 (FIG. 1) sequentially deposits multiple layers—including a dummy layer 140 and a nitride liner layer 142—over IC device 100 (FIG. 2B). Dummy layer 140 covers at least bottom surface 134 and sidewall surface 132 of contact hole 130, but may also cover the topmost surface of IC device 100 (as shown in FIG. 2B). In an embodiment, dummy layer 140 is deposited uniformly across the top surface of IC device 100. Dummy layer 140 includes silicon, germanium, silicon germanium (SiGe), low density silicon nitride, low density silicon oxide, and/or other suitable materials. Since dummy layer 140 is to be selectively etched later to form air gaps (at operation 26), the composition of dummy layer 140 may be tailored or optimized for such a selective etching process. Dummy layer 140 may be formed by one or more methods such as PECVD, ALD, and/or other suitable deposition or oxidation processes. In some embodiments, the dimensions of dummy layer 140, including its height (H) and width (W1 or W2) as shown in FIG. 2B, are tailored to control the dimensions of air gaps formed in IC device 100 (described below). As FIG. 2B indicates, dummy layer 140 may extend above top surfaces of gate stacks 116a and 116b, and also extend below bottom surfaces of gate stacks 116a and 116b. In an embodiment, the height of dummy layer 140 is about 20 to about 50 nm, and the width of dummy layer 140 is about 1 to about 5 nm. The suitable width of dummy layer 140 may relate to a width of contact hole 130 (as shown in FIG. 2A). In an embodiment, a ratio between the width of dummy layer 140 and the width of contact hole 130 is about 1:10 to about 1:5. For example, if contact hole 130 is 15 nm wide, dummy layer 140 may be about 1.5 nm to about 3 nm wide (on each side of contact hole 130). The range is determined because dummy layer 140 should be wide enough to create sufficient air gap width (described below) but narrow enough to allow sufficient volume to form a reliable contact feature within contact hole 130. For example, if dummy layer 140 on each side of contact hole 130 takes up 40% of the width of contact hole 130, there would be less than 20% of space left to fill the contact feature (since there is also nitride liner layer 142 which also has a width).

Nitride liner layer 142 may comprise various material(s) such as carbon-doped SiN, high density SiN, and/or other suitable materials. Nitride liner layer 142 may be formed by one or more methods such as PECVD, ALD, and/or other suitable deposition or oxidation processes. In some embodiments, nitride liner layer 142 is a thin layer with a generally conformal thickness across the top of IC device 100. The conformal quality of nitride liner layer 142 through sidewall surface 132 helps avoid a current leakage path from contact plug 136 (formed at operation 24) to gate stacks 116a and 116b, or vice versa. In some embodiments, operation 14 may be repeatedly executed to reach a target thickness of nitride liner layer 142.

Figures 2C, 2D:
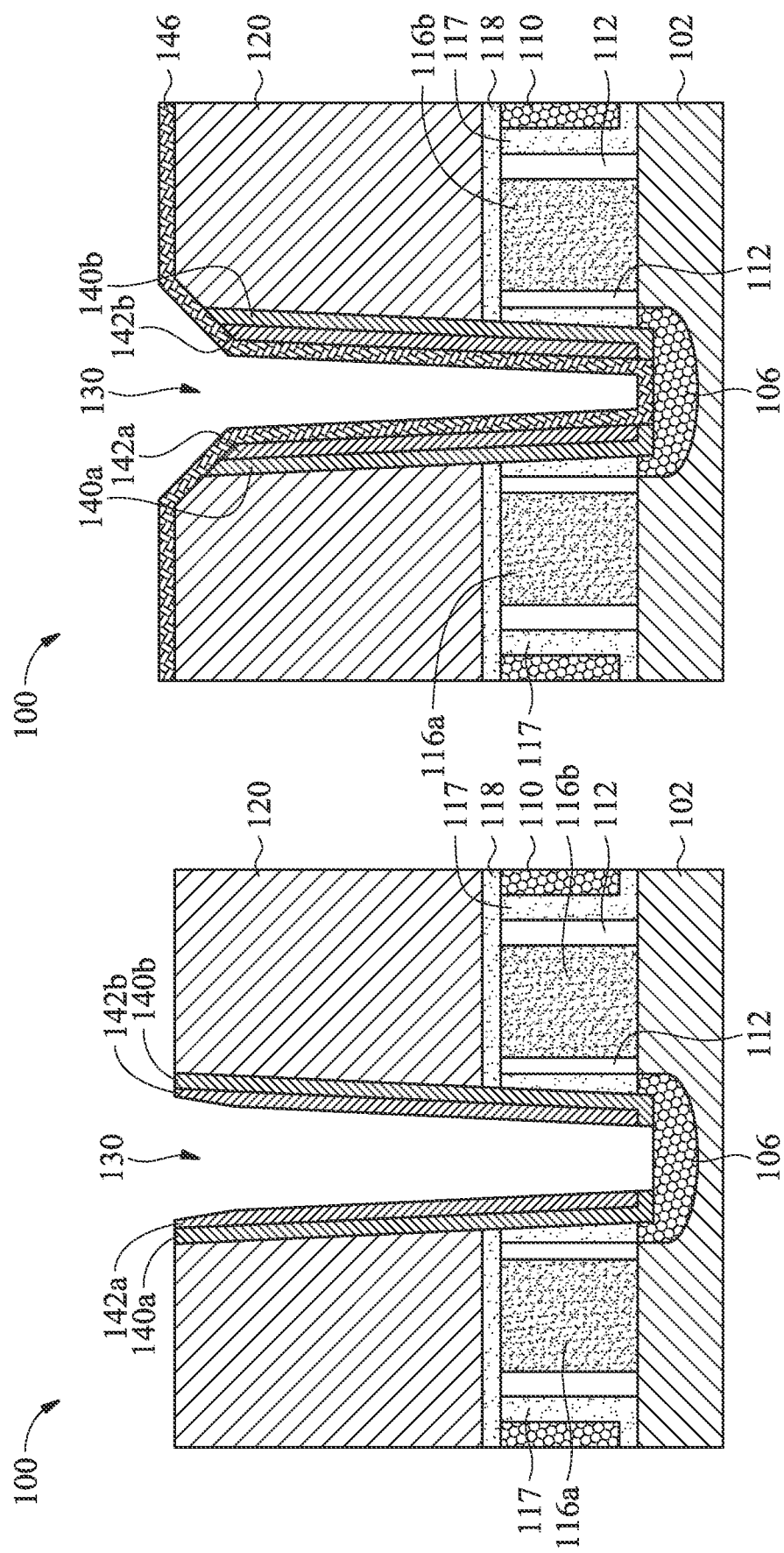

At operation 16, method 10 (FIG. 1) performs a selective etching process to remove parts of dummy layer 140 and nitride liner layer 142, thereby generating dummy features 140a and 140b as well as nitride liners 142a and 142b, respectively, on sidewall surface 132 (FIG. 2C). Note that dummy features 140a and 140b may represent the same dummy feature in the three-dimensional IC device 100, but they are labeled separately for clarity in the cross-sectional views herein. The same consideration applies to other labels such as nitride liners 142a and 142b (and air gaps 150a and 150b described further below). Since the top surface of S/D feature 106 is to be exposed, the selective etching process is performed so as to etch through nitride liner layer 142 and dummy layer 140 on bottom surface 134 and on the topmost surface of IC device 100. But the selective etching process does not etch through nitride liners 142a and 142b, which are the sidewall segments of the nitride layer 142. Further, in the selective etching process, operation 16 may "thin" (remove a thickness portion of) nitride liners 142a and 142b. Indeed, if nitride liners 142a and 142b are too thick, they may block lateral space for subsequent processes. Therefore, such thinning opens up more space for deposition of contact plug 136. But operation 16 is controlled such that it stops before nitride liners 142a and 142b are penetrated through. The remaining thickness of nitride liners 142a and 142b remains in the final product. In some embodiments, nitride liners 142a and 142b are each about 1-5 nm thick. As described above, a suitable thickness or width of nitride liners 142a and 142b and a suitable thickness or width of nitride liners 142a and 142b are determined to allow sufficient space or volume for a reliable contact feature to form inside contact hole 130. Additionally, dummy features 140a and 140b (located on sidewall surface 132 and on the edge of bottom surface 134) are shielded from the selective etching process by nitride liners 142a and 142b. For example, as shown in the cross-sectional view of FIG. 2C, dummy features 140a and 140b may each take the form of an "L" shape at the bottom of contact hole 130.

At operation 18, method 10 (FIG. 1) forms a metal layer 146 over IC device 100 (FIG. 2D). Metal layer 146 covers at least bottom surface 134 of contact hole 130, but may also cover sidewall surface 132 and the topmost surface of IC device 100 (as shown in FIG. 2D). For example, metal layer 146 may be uniformly deposited over IC device 100 using an ALD process. Metal layer 146 may comprise various material(s) such as nickel (Ni), cobalt (Co), tungsten (W), tantalum (Ta), or titanium (Ti), combinations thereof, or other suitable material.

Figures 2E, 2F:
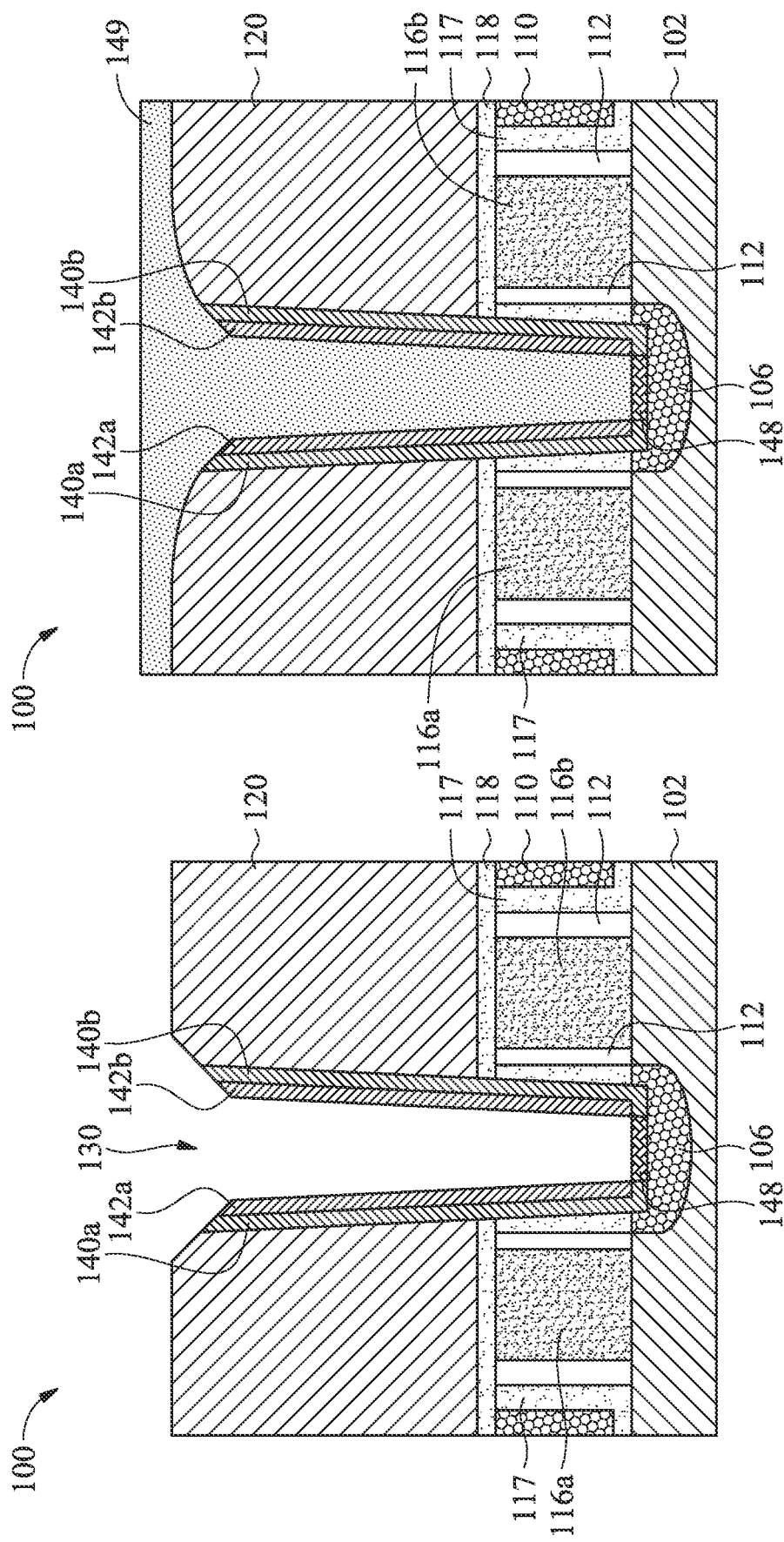

At operation 20, method 10 (FIG. 1) forms a metal silicide 148 on bottom surface 134 of contact hole 130 by selectively etching and converting metal layer 146 (FIG. 2E). In an embodiment of forming metal silicide 148, metal layer 146 is first annealed at an elevated temperature such that metal layer 146 reacts with semiconductor material(s) in S/D feature 106 to form metal silicide. Then, non-reacted portions of metal layer 146 (on sidewall surface 132 and topmost surface of IC device 100) are removed, thereby leaving metal silicide 148 on bottom surface 134. Metal silicide 148 may include nickel silicide, cobalt silicide, titanium silicide, or other suitable silicidation or germanosilicidation. Metal silicide 148 may cover a heavily doped region of S/D feature 106 and in some cases may be considered part of S/D feature 106. For example, in a p-type S/D feature 106, its heavily doped region may comprise SiGe, and therefore metal silicide 148 may comprise SiGeNi, SiGeCo, SiGeW, SiGeTa, or SiGeTi. In an n-type S/D feature 106, its heavily doped region may comprise SiP, and therefore metal silicide 148 may comprise SiPNi, SiPCo, SiPW, SiPTa, or SiPTi.

At operation 22, method 10 (FIG. 1) forms a contact layer 149 over IC device 100 (FIG. 2F). Contact layer 149 may include aluminum (Al), tungsten (W), copper (Cu), cobalt (Co), titanium (Ti), combinations thereof, or other suitable material. Note that contact or metal layers disclosed herein, such as metal layer 146 and contact layer 149, may also contain non-metal material(s). For instance, contact layer 149 may include a barrier layer made of conductive nitrides such as TaN or TiN. Contact layer 149 may be formed by PVD, CVD, ALD, plating, or other suitable methods. As shown in FIG. 2F, contact layer 149 penetrates ILD layer 120, CESL 118, and ILD layer 110. Further, contact layer 149 is electrically coupled to S/D feature 106 through metal silicide 148. In an alternative embodiment, contact layer 149 may be directly connected to S/D feature 106 without an intermediate silicide feature.

At operation 24, method 10 (FIG. 1) forms contact plug 136 from contact layer 149 (FIG. 2G). In an embodiment, a chemical mechanical planarization (CMP) process is used to remove a top thickness of IC device 100, including top portions of contact layer 149, ILD layer 120, dummy features 140a and 140b, and nitride liners 142a and 142b. A contact plug is sometimes also called a via, a via plug, a metal contact, or a metal plug. To facilitate operation 28, the CMP process is sufficiently long to ensure exposure of dummy features 140a and 140b.

At operation 26, method 10 (FIG. 1) removes by etching the remaining portions of dummy features 140a and 140b to form air gaps 150a and 150b (FIG. 2H). Specifically, air gap 150a is formed between contact plug 136 and gate stack 116a to reduce a first capacitance therebetween, and air gap 150b is formed between contact plug 136 and gate stack 116b to reduce a second capacitance therebetween. Capacitances are reduced because air has a dielectric constant (k) of about one, which is lower than other dielectric materials. In some embodiments (e.g., when there is no overlay shift), air gaps 150a and 150b have about the same dimensions, and the first and second capacitances are about equal. But if there is overlay shift (as described below in FIGS. 5A-5C), air gaps 150a and 150b may have different dimensions, and the first and second capacitances may be different. Unequal capacitances on two sides of contact plug 136 may impact related circuitry unequally, but since both the first and second capacitances are reduced herein, their overall impact on circuitry is reduced.

It should be noted that method 10 disclosed herein forms air gaps 150a and 150b after forming contact plug 136. This differs from conventional air gap formation approaches, which formed air gaps before forming their corresponding contact hole (and contact plug). Such a change in sequence is counter-intuitive, for example, because post-plug formation of air gaps brings unique etch selectivity considerations (discussed below), and conventional approaches were unable to achieve such etch selectivity. But post-plug formation of air gaps, as disclosed herein, brings various benefits. For instance, conventional air gaps formed before a contact plug had high risks of short circuit between the contact plug and a neighboring gate stack. That is because, when etching a contact hole between two sealed air gaps, the etching may expose such sealed air gaps. As a result, in the next step of forming nitride liners in the contact hole, the nitride liners were prone to fill the now-exposed air gaps ("punch through"), especially if there was an overlay shift. The volume of the air gaps was significantly reduced, and worse, the nitride liners could lead to a short circuit between the contact plug (formed after the nitride liners) and the neighboring gate stack, which may cause device failure.

The present disclosure avoids such issues by forming air gaps 150a and 150b after the formation of contact plug 136 therebetween. First, air gaps 150a and 150b are self-aligned because their lateral locations and profiles are determined by the lateral locations and profiles of dummy features 140a and 140b, which are disposed close to contact plug 136. Second, there is no etching at the vicinity of air gaps 150a and 150b, and thus any punch-through issues are avoided. This in turn improves device reliability and enables higher breakdown voltage. Third, since the volume of air gaps is precisely controllable by adjusting heights and/or widths of dummy features, the coupling capacitance between gate stack 116a or 116b and contact plug 136 can be effectively controlled. Optimal AC/DC gain may be achieved without potential air gap damages. Fourth, unlike conventional approaches where air gaps were lower than top surfaces of gate stacks, air gaps 150a and 150b disclosed herein extend above the top surfaces of gate stacks 116a and 116b. Therefore, more reduction in the coupling capacitance is allowed between the upper portions of gate stack 116a and contact plug 136, and between the upper portions of gate stack 116b and contact plug 136. In addition, as shown in the cross-sectional view of FIG. 2H, air gaps 150a and 150b (like dummy features 140a and 140b from which air gaps 150a and 150b are formed) may each take the form of an "L" shape at the bottom of contact hole 130. The horizontal portion of the "L" shape of air gap 150a may have a width that roughly equals a total width of dummy feature 140a and nitride liner 142a. The horizontal portion of the "L" shape of air gap 150b may have a width that roughly equals a total width of dummy feature 140b and nitride liner 142b. Since air gaps 150a and 150b's horizontal portions underneath nitride liners 142a and 142b are relatively small, nitride liners 142a and 142b (which are attached to contact plug 136) have no structural support issues.

In an embodiment, the material of dummy features 140a and 140b has etch selectivity with respect to nitride liner layer 142 and ILD layer 120 such that dummy features 140a and 140b can be fully removed without substantially impacting either ILD layer 120, or nitride liners 142a and 142b, or gate stacks 116a and 116b. In an embodiment, dummy features 140a and 140b are selectively removed by an etching process that etches dummy features 140a and 140b at least 10 times (or 20 times, or 50 times) faster than other materials in contact with dummy features 140a and 140b. Such etch selectivity depends on the different choices of materials for dummy layer 140, nitride liner layer 142, and ILD layer 120, and gate stacks 116a and 116b. Thus, the material makeup of these layers is considered in a combined fashion. For example, dummy layer 140 may use material(s) selected from the group of silicon, germanium, silicon germanium (SiGe), low density nitride such as silicon nitride, and low density oxide such as silicon oxide. At the same time, nitride liner layer 142 uses material(s) selected from the group of carbon-doped nitride such as silicon nitride and high density nitride such as silicon nitride. At the same time, ILD layer 120 uses either an oxide formed by FCVD or a dopant-doped oxide (e.g., silicon oxide doped with boron at a doping concentration of $10^{19}$-$10^{20}$). Gate stacks 116a and 116b may use cobalt (Co) and/or other suitable metals. The etch selectivity is based on different reactivity to the same etchant. For instance, when dummy layer 140 uses low density $Si_3N_4$, and nitride liner layer 142 uses high density $Si_3N_4$, dummy layer 140 has a faster etch rate because low density $Si_3N_4$ is easier to be oxidized by the etchant than high density $Si_3N_4$. Further, it should be understood that "low density" and "high density" are relative terms to signify differences in doping concentrations. For example, dummy layer 140 is doped with an appropriate dopant (e.g., fluorine) at a doping concentration of $1-9*10^{13}$ (unit is per square centimeter), while nitride liner layer 142 is doped with an appropriate dopant (e.g., carbon) at a doping concentration no less than $1*10^{15}$.

The selective etching process at operation 26 may include dry etching, wet etching, reactive ion etching (RIE), and/or other suitable processes. For example, a dry etching process may implement an oxygen-containing gas, a fluorine-containing gas (e.g., $CF_4$, $SF_6$, $CH_2F_2$, $CHF_3$, and/or $C_2F_6$), a chlorine-containing gas (e.g., $Cl_2$, $CHCl_3$, $CCl_4$, and/or $BCl_3$), a bromine-containing gas (e.g., HBr and/or $CHBR_3$), an iodine-containing gas, other suitable gases and/or plasmas, and/or combinations thereof. In an embodiment, a plasma etching process is conducted at a flow rate of about 500 standard cubic centimeters per minute (sccm) to about 2000 sccm. For another example, a wet etching process may comprise etching in diluted hydrofluoric acid (DHF); potassium hydroxide (KOH) solution; ammonia; a solution containing hydrofluoric acid (HF), nitric acid ($HNO_3$), and/or acetic acid ($CH_3COOH$); or other suitable wet etchant. The wet etching process may be conducted in any suitable manner such as by immersing IC device 100 into the wet etchant for a time period (e.g., less than 1 hour).

Figure 2I:
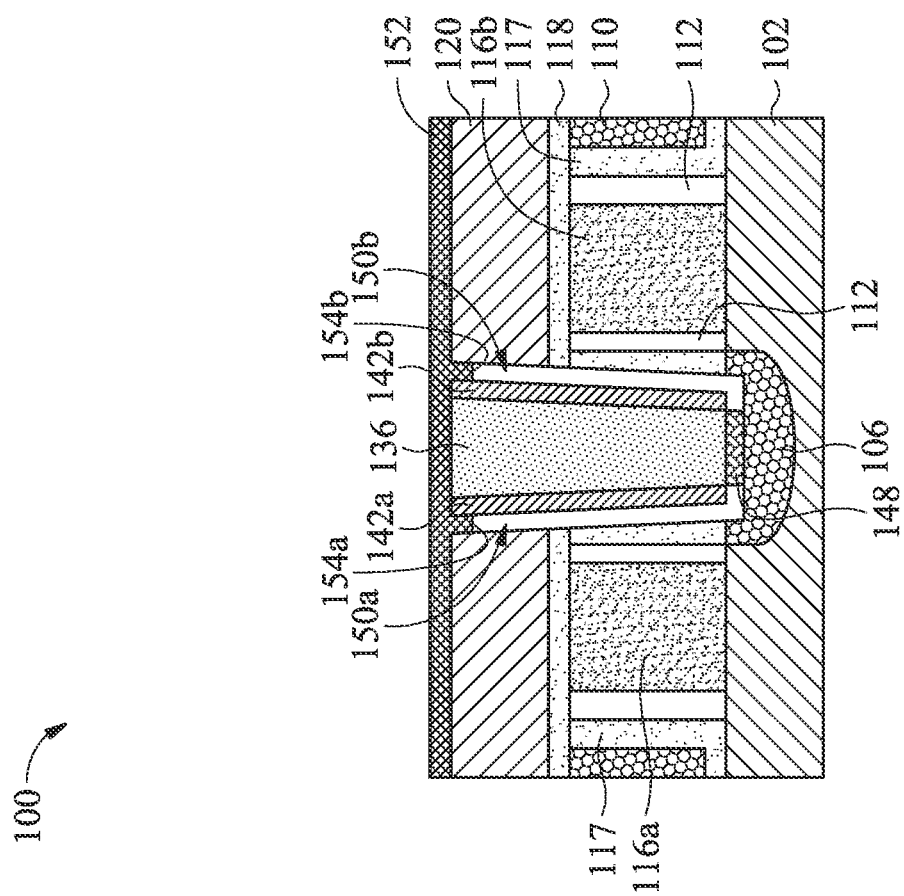

At operation 28, method 10 (FIG. 1) seals air gaps 150a and 150b by forming a seal layer 152 (FIG. 2I) that covers air gaps 150a and 150b. Seal layer 152 may be deposited using CVD, PVD, ALD, and/or other suitable methods. Seal layer 152 may use any suitable material as long as it ensures full enclosure of air gaps 150a and 150b to prevent other materials from getting into air gaps 150a and 150b. Upon formation of seal layer 152, the volumes of air gaps 150a and 150b are finalized. As shown in FIG. 2I, seal layer 152 interfaces air gaps 150a and 150b (via respective interfaces 154a and 154b) at a height that is above the top surfaces of gate stacks 116a and 116b. In some embodiments, a height difference between interface 154a (or 154b) and the top surfaces of gate stacks 116a and 116b is about 20% to about 40% of the height of contact hole 130. For example, when the height of contact hole 130 is about 30 nm, the height difference is about 6 to about 12 nm. The interfaces 154a and 154b may also be slightly lower than the top surface of ILD layer 120 because during their formation seal layer 152 penetrates slightly into air gaps 150a and 150b (e.g., for 1-4 nm). In some embodiments, air gaps 150a and 150b have very small width(s) (e.g., no more than 10 nm, 5 nm, 3 nm, or 2 nm), thus there is no risk of seal layer 152 penetrating deep into air gaps 150a and 150b.

Figure 2J:
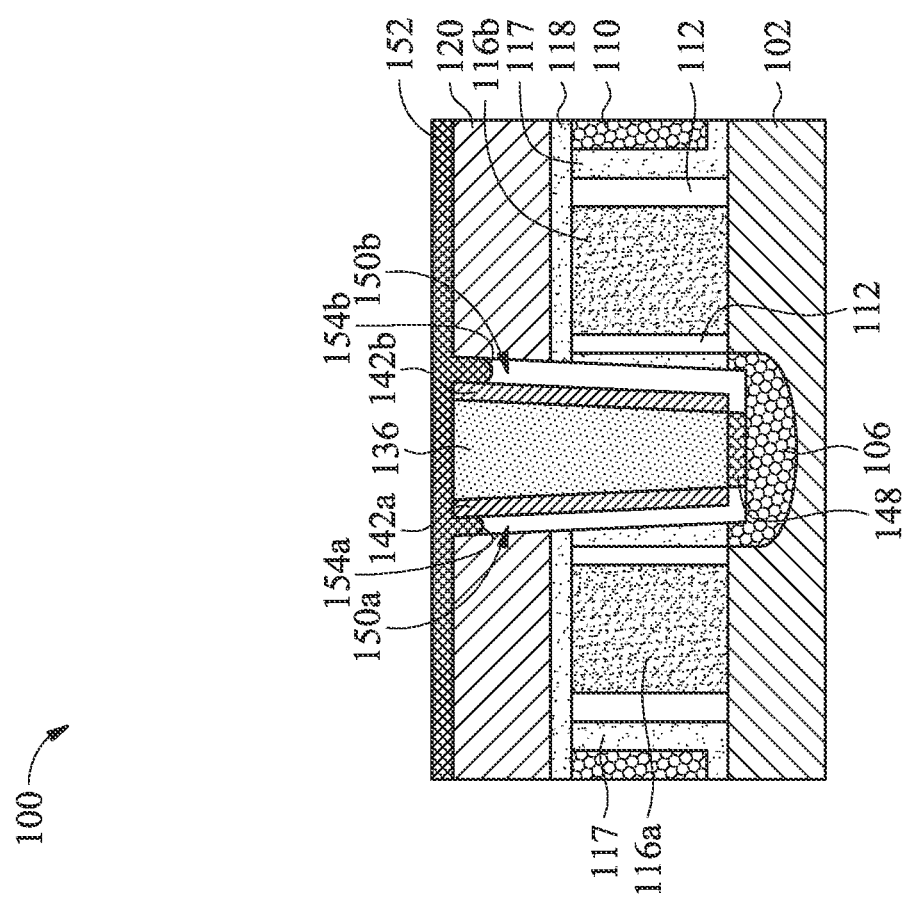

As illustrated in FIG. 2I, seal layer 152 may interface air gaps 150a and 150b at about the same height. However, in some embodiments, interfaces at the top of air gaps 150a and 150b may have different height and/or surface profiles. As illustrated in FIG. 2J which represents a variation of FIG. 2I, seal layer 152 interfaces air gap 150a at interface 154a and air gap 150b at interface 154b, where interface 154a is higher than interface 154b. This may occur, for example, when the width of air gap 150a is smaller than the width of air gap 150b. Further, interface 154a, interface 154b, or both, may have a flat surface (as shown in FIG. 2I) or a curved surface (as shown in FIG. 2J). The curved surface may be formed as a natural result of seal layer 152 penetrating into the space for air gaps 150a and 150b.

In method 10, each component may be formed with suitable dimensions (e.g., thickness, height, depth or width). For example, in an embodiment, gate spacers 112 and gate stacks 116a and 116b each has a thickness between 15-25 nm (e.g., about 20 nm), ILD layer 120 has a thickness between 50-80 nm (e.g., about 65 nm). At operation 24, the CMP process may reduce the thickness of ILD layer 120 to 10-20 nm (e.g., about 15 nm). At operation 28, seal layer 152 may be several nanometers thick (e.g., 2-10) nm.

Although not elaborated herein, after operation 28 method 10 performs further processes to IC device 100. For example, another contact plug may be formed over (and electrically connected) to contact plug 136. Other etch stop layers, ILD layers, and metal wires may be formed. The metal wires are configured to interconnect upper plugs as well as other circuit features.

Method 10 may be used to fabricate not only IC device 100 (as shown in FIG. 2I) but also variations thereof. For example, FIGS. 3A, 3B, 3C, 4A, 4B, 5A, 5B, and 5C illustrate cross-sectional views of different IC device embodiments. Since the IC devices shown in these figures share various common features with IC device 100 discussed above, in the interest of conciseness such common features will not be described repeatedly.

Figure 3C:
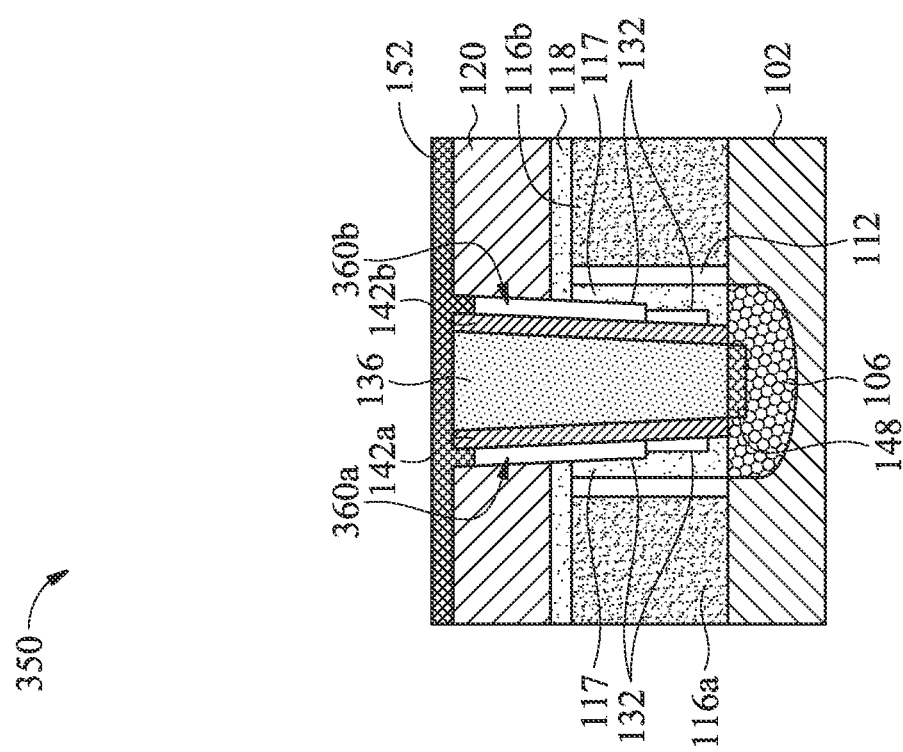

FIGS. 3A-3C illustrate vertical depth control of air gaps disclosed herein according to some embodiments of the present disclosure. Specifically, FIG. 3A illustrates a cross-sectional view of an IC device 200, FIG. 3B illustrates a cross-sectional view of an IC device 300, and FIG. 3C illustrates a cross-sectional view of an IC device 350. Compared to IC device 100, which has air gaps 150a and 150b that vertically extend to the top surface of S/D feature 106 (or be horizontally aligned with the bottom surfaces of the gate stacks 116a and 116b), IC devices 200, 300, and 350 have relatively shallower or shorter air gaps. Specifically, IC device 200 has air gaps 210a and 210b that do not vertically extend to the top surface of its S/D feature. IC device 300 has air gaps 310a and 310b that do not vertically extend to the top surface of its S/D feature. In other words, the lowest portions of air gaps 310a and 310b are higher than bottom surfaces of gate stacks 116a and 116b (e.g., with a height difference that is about 5%-10% of the height of contact hole 130). IC device 350 has air gaps 360a and 360b that are even shallower or shorter than air gaps 310a and 310b, respectively (e.g., with a height difference that is about 20%-40% of the height of contact hole 130). Note that the highest portions of air gaps 310a and 310b are still higher than top surfaces of gate stacks 116a and 116b. The heights of air gaps may be equal or different (e.g., the highest portions of air gaps 310a and 310b may have a different height than those of air gaps 150a and 150b as well as those of air gaps 360a and 360b). As discussed above, the ability to precisely control the depth of air gaps helps achieve optimal AC/DC gain without potential air gap damages.

To realize depth control of air gaps as illustrated in FIGS. 3A-3C, the profile of dummy layer 140 is tailored or adjusted in method 10. Various approaches may be used to control the depth of air gaps. In a first approach as shown in FIG. 3A, dummy features 140a and 140b are removed at operation 26 in a way that their remaining height is controllable. For example, when etching dummy features 140a and 140b, the time or duration of the etch process may be controlled to control the etch depth and therefore control the remaining height. An etch rate of the dummy features 140a and 140b may be constant or may vary during the etch process, but etch time is a reliable indicator of how much thickness of dummy features 140a and 140b has been etched. In the first approach, the unetched portions of dummy features 140a and 140b remain at the bottom of air gaps 210a and 210b, respectively, as shown in FIG. 3A.

A second approach of depth control utilizes the fact that, since the air gaps may be formed by fully removing dummy features 140a and 140b (which are formed from the dummy layer 140), the initial profile of dummy layer 140 may substantially determine the profiles of air gaps. Thus, the second approach forms an initial dummy layer 140 that does not reach the bottom of contact hole 130. For example, in operation 12, the starting IC device may already have contact hole 130 with a tiered sidewall surface 132. Sidewall surface 132 may obtain a tiered profile where its upper tier is wider than its bottom tier (as shown in FIG. 3B and FIG. 3C) using any suitable processes (e.g., multiple masking and etching steps). Next, dummy features 140a and 140b may be formed on the upper tier(s) of sidewall surface 132, and nitride liners 142a and 142b are formed adjacent to dummy features 140a and 140b. As shown in FIG. 3B and FIG. 3C, nitride liners 142a and 142b still reach S/D feature 106 at the bottom of contact hole 130. Later, in operation 26 dummy features 140a and 140b are removed to form air gaps 310a and 310b as shown in FIG. 3B (or 360a and 360b as shown in FIG. 3C). In the second approach, since dummy features 140a and 140b are fully removed, what underlies the air gaps may be ESL 117, as shown in FIG. 3B and FIG. 3C (instead of remaining portions of dummy features 140a and 140b, as in the first approach shown in FIG. 3A).

FIGS. 4A and 4B illustrate lateral width control of air gaps disclosed herein according to some embodiments of the present disclosure. Specifically, FIG. 4A illustrates a cross-sectional view of an IC device 400, and FIG. 4B illustrates a cross-sectional view of an IC device 450. Compared to IC device 100, which has relatively narrow air gaps 150a and 150b (e.g., whose width is about 10% to about 20% of the width of contact hole 130) that are laterally separated from spacer 112 by ESL 117, IC devices 400 and 450 have relatively wide air gaps (e.g., whose width is about 20% to about 25% of the width of contact hole 130). Specifically, IC device 400 has air gaps 410a and 410b that directly contact spacer 112 without the intervening ESL 117. IC device 450 has air gaps 460a and 460b that are even wider (e.g., whose width is about 25% to about 35% of the width of contact hole 130) than air gaps 410a and 410b, respectively. In an embodiment, air gaps 460a and 460b may reach conductive portions of gate stacks 116a and 116b, respectively. The maximal of air gaps such as air gaps 460a and 460b may be limited by the need to have sufficient space or volume to fill a contact feature into contact hole 130, as described. For example, when the overall width of contact hole 130 is about 15 nm, the contact feature may be about 5 nm wide, and the air gaps on each side of the contact feature may be about 5 nm wide. The ability to precisely control the width of air gaps helps achieve optimal AC/DC gain without potential air gap damages. Note that exposing gate stacks to air gaps, as shown in FIG. 4B, carries no adverse risks such as shorting circuit because the air gaps do not contain any conductive or otherwise harmful materials.

To realize width control of air gaps as illustrated in FIGS. 4A and 4B, the profile of dummy layer 140 is tailored or adjusted in method 10. Since the air gaps are formed by removing dummy features 140a and 140b (which are formed from the dummy layer 140), the profile of dummy layer 140 substantially determines the profiles of air gaps. For example, in operation 12 ESL 117 may have been removed such that contact hole 130 directly contacts spacers 112. In operation 12 upper portions of spacers 112 may have been removed such that contact hole 130 reaches upper-corner conductive portions of gate stacks 116a and 116b. In operation 14 dummy layer 140 and nitride liner layer 142 are formed as described above. Later, in operation 26 dummy layer 140 is selectively removed to form air gaps 410a and 410b as shown in FIG. 4A (or 460a and 460b as shown in FIG. 4B).

Figure 5C:
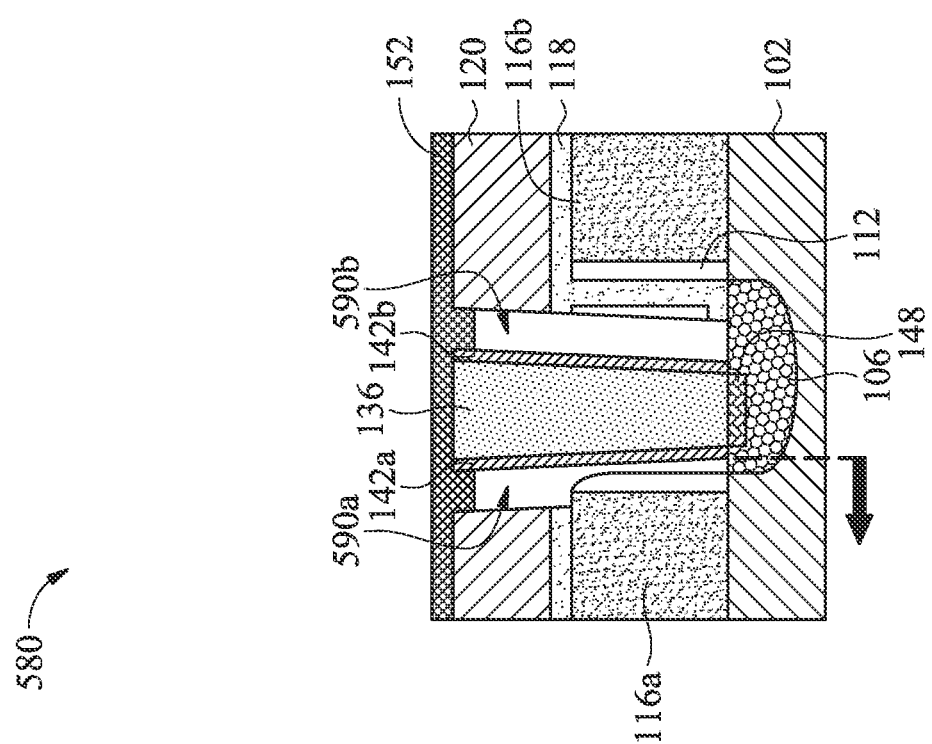

FIGS. 5A-5C illustrate overlay shift adaptability of air gaps disclosed herein according to some embodiments of the present disclosure. Overlay shift occurs when a mask for defining an upper layer does not match perfectly with lower layer components when such components are on the scale of nanometers (e.g., when contact hole 130 formed using the mask does not sit right in the middle of gate stacks 116a and 116b). Specifically, FIG. 5A illustrates a cross-sectional view of an IC device 500, FIG. 5B illustrates a cross-sectional view of an IC device 550, and FIG. 5C illustrates a cross-sectional view of an IC device 580. Compared to IC device 100, in which contact plug 136 sits about the center point between gate stacks 116a and 116b (assuming no overlay shift), IC devices 500 and 550 have air gaps that are offset from the center point between gate stacks 116a and 116b (assuming there is overlay shift to the left side). In both IC devices 500 and 550, contact plug 136 is closer to gate stack 116a than to gate stack 116b. IC device 500 has relatively narrow air gaps 510a and 510b, and IC device 550 has relatively wider air gaps 560a and 560b. In FIG. 5A, air gap 510a directly contacts spacer 112 (but does not laterally extend over gate stack 116a), while air gap 510b is separated from spacer 112 by at least ESL 117 (and potentially by portions of ILD layer 110). In FIG. 5B, air gap 560a directly contacts spacer 112, directly contacts a conductive portion of gate stack 116a, and laterally extends over gate stack 116a. Note that exposing gate stack 116a to air gap 560a carries no adverse risks such as shorting circuit because air gap 560a does not contain any conductive or otherwise harmful materials. On the other hand, air gap 560b directly contacts spacer 112 but does not contact or laterally extend over gate stack 116b.

FIG. 5C is similar to FIG. 5B in that, like air gap 560a, air gap 590a directly contacts spacer 112, directly contacts a conductive portion of gate stack 116a, and laterally extends over gate stack 116a. On the other hand, air gap 590b directly contacts spacer 112 but does not contact or laterally extend over gate stack 116b. As shown in FIG. 5C, in some embodiments, when gate stack 116a is directly exposed to air gap 590a, a corner portion of gate stack 116a and its spacer 112 may get removed during a wet etching process that forms air gap 590a, thereby creating a rounded corner profile. The shape of the rounded corner profile may depend on various factors such as materials of gate stack 116a and spacer 112 as well as formation conditions of air gap 590a (e.g., etchant, duration, etc.).

As discussed above, the present disclosure allows overlay shift adaptability of air gaps because the air gaps herein are formed after the formation of contact plug 136. Had the air gaps been formed before or concurrently with the formation of contact plug 136, the air gaps would be prone to be filled by subsequent processes ("punch through"). In the present disclosure, there is a safe margin between gate stack 116a or 116b and contact plug 136 even with overlay shift. There is no contact-etching-induced punch through of air gaps, which improves device reliability and leads to a higher breakdown voltage.

As illustrated above, in the present disclosure, the temporal change in the formation of air gaps leads to structural and positional changes of various components. For example, air gaps now extend above the top surfaces of gate stacks. In some embodiments, air gaps are formed such that their lowest portions are situated at the same height as bottom surfaces of surrounding gate stacks (FIG. 2I). In other embodiments, air gaps are formed such that their lowest portions are situated higher than bottom surfaces of surrounding gate stacks (FIGS. 3B and 3C). In some embodiments, a first air gap is separated from a first gate electrode layer by at least a gate spacer (e.g., air gap 560b in FIG. 5B), while a second air gap is in direct contact with both a second spacer and an upper portion of a second gate electrode layer (e.g., air gap 560a in FIG. 5B). In FIG. 5B, air gap 560a even laterally extends over the second gate electrode layer of the second gate stack.

Although not intended to be limiting, one or more embodiments of the present disclosure provide many benefits to a semiconductor device and the formation thereof. For example, the air gap formation techniques disclosed herein realizes self-aligned air gaps with controllable profiles. Coupling capacitance between a gate stack and a contact plug can be effectively controlled. There is no punch through issues, so device reliability is improved with higher breakdown voltage. Therefore, optimal AC/DC gain may be achieved without potential air gap damages. Embodiments of the disclosed methods can be readily integrated into existing manufacturing processes and technologies, such as middle end of line (MEOL) and back end of line (BEOL) processes.

In one example aspect, the present disclosure provides a method for IC fabrication, which comprises providing a device structure including a substrate, an S/D feature on the substrate, a gate stack on the substrate, a contact hole over the S/D feature; and a dummy feature over the S/D feature and between the gate stack and the contact hole. The method further comprises forming in the contact hole a contact plug that is electrically coupled to the S/D feature, and, after forming the contact plug, selectively removing the dummy feature to form an air gap that extends higher than a top surface of the gate stack. The method further comprises forming over the contact plug a seal layer that covers the air gap.

In an embodiment, the device structure further includes first and second gate stacks, where the first air gap is formed between the contact plug and the first gate stack to reduce a first capacitance therebetween, and where the second air gap is formed between the contact plug and a second gate stack to reduce a second capacitance therebetween. In an embodiment, the seal layer interfaces the first and second air gaps at a height that is above top surfaces of the first and second gate stacks. In an embodiment, the first and second air gaps are formed such that bottom surfaces of the first and second air gaps are situated higher than bottom surfaces of the first and second gate stacks. In an embodiment, the first gate stack comprises a gate electrode layer and a spacer in contact with the gate electrode layer. The first air gap is separated from the spacer by at least one more dielectric layer. In an embodiment, the second gate stack comprises a gate electrode layer and a spacer in contact with the gate electrode layer, and the second air gap is in direct contact with both the spacer and an upper portion of the gate electrode layer. In an embodiment, the second air gap laterally extends over the gate electrode layer of the second gate stack. In an embodiment, forming the contact plug comprises depositing a metal layer covering the device structure, and removing a top portion of the metal layer using a CMP process. The CMP process also exposes the first and second dummy features facilitate selective removal of the first and second dummy features after the formation of the contact plug. In an embodiment, the first and second dummy features have etch selectivity in an etching process such that the first and second dummy features are selectively removed by the etching process that etches the first and second dummy features at least 10 times faster than other materials in contact with the first and second dummy features. In an embodiment, the first air gap formed from the first dummy feature is in direct contact with a first nitride liner disposed between the contact hole and the first dummy feature.

In another example aspect, the present disclosure provides a device structure including a substrate, first and second gate stacks on the substrate, first and second dummy features between the first and second gate stacks, and a contact plug between the first and second dummy features. A method comprises etching the first and second dummy features to form first and second air gaps, respectively, and forming a seal layer over the contact plug to seal the first and second air gaps. The seal layer interfaces the first and second air gaps at a height that is above top surfaces of the first and second gate stacks. In an embodiment, profiles of the first and second air gaps are controlled based on profiles of the first and second dummy features. In an embodiment, the first and second air gaps are formed such that bottom surfaces of the first and second air gaps are situated higher than bottom surfaces of the first and second gate stacks. In an embodiment, the first air gap is formed such that the first air gap is separated from a first gate electrode layer of the first gate stack by at least a first spacer. The second air gap is formed such that the second air gap is in direct contact with both a second spacer and a conductive portion of the second gate stack and that the second air gap laterally extends over the second gate stack. In an embodiment, the device structure further includes a first nitride liner between the contact plug and the first dummy feature, and an ILD layer in direct contact with the first dummy feature. The first and second dummy features are etched faster than both the first nitride liner and the ILD layer, as one or more materials for the first nitride liner is selected from the group consisting of carbon-doped silicon nitride and high density silicon nitride, as one or more materials for the first and second dummy features is selected from the group consisting of silicon, germanium, silicon germanium, low density silicon nitride, and low density silicon oxide, and as one or more materials for the ILD layer is either an oxide formed by flowable chemical vapor deposition (FCVD) or a dopant-doped oxide.

In another example aspect, the present disclosure provides an IC device comprising a substrate, an S/D feature disposed on the substrate, a contact plug disposed over the S/D feature and electrically coupled to the S/D feature, a gate stack disposed over the S/D feature and adjacent to the contact plug, an air gap disposed between the contact plug and the gate stack, and a seal layer covering the air gap. An interface between the seal layer and the air gap is higher than a top surface of the gate stack. In an embodiment, the IC device further comprises a nitride liner between the contact plug and the air gap, and the nitride liner is in direct contact with both the contact plug and the air gap without any intervening dielectric layer. In an embodiment, one or more materials for the nitride liner is selected from the group consisting of carbon-doped silicon nitride and high density silicon nitride. In an embodiment, the IC device further comprises an ILD layer in direct contact with the air gap. One or more materials for the ILD layer is an oxide formed by flowable chemical vapor deposition (FCVD) or a dopant-doped oxide. In an embodiment, the gate stack comprises a gate electrode layer and a spacer that touches the gate electrode layer. The air gap touches both the spacer and an upper portion of the gate electrode layer, and the air gap laterally extends over the gate electrode layer.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A device comprising:
a source/drain feature disposed on a substrate;
a gate stack disposed on the substrate and associated with the source/drain feature;
a first interlayer dielectric layer disposed on the substrate;
a contact feature extending through the first interlayer dielectric layer to the source/drain feature;
a nitride layer disposed directly on and extending along a sidewall of the contact feature to the source/drain feature;
a silicon-containing layer disposed directly on and extending along a sidewall of the nitride layer to the source/drain feature; and
a seal layer disposed directly on the first interlayer dielectric layer, the nitride layer and the contact feature, the seal layer sealing an air gap defined by the nitride layer, the silicon-containing layer, the sealing layer and the first interlayer dielectric layer, wherein the nitride layer, the silicon-containing layer, the sealing layer and the first interlayer dielectric layer are exposed to the air gap.

2. The device of claim 1, wherein the nitride layer extends continuously from the seal layer to the source/drain feature.

3. The device of claim 1, further comprising:
a first etch stop layer disposed directly on the silicon layer, and
a second etch stop layer dispose directly on the gate stack, and
wherein the first and second etch stop layers are exposed to the air gap.

4. The device of claim 3, wherein the first etch stop layer extends to the source/drain feature.

5. The device of claim 1, wherein the gate stack extends to a first height above the substrate and the silicon-containing layer extends to a second height above the substrate that is different than the first height.

6. The device of claim 5, wherein the first height is greater than the second height.

7. The device of claim 1, wherein the silicon-containing layer includes a material selected from the group consisting of silicon germanium, silicon nitride and silicon oxide.

8. A device comprising:
a source/drain feature disposed on a substrate;
a gate stack disposed on the substrate and associated with the source/drain feature, the gate stack extending to a first height above the substrate;
a first interlayer dielectric layer disposed on the substrate;
a contact feature extending through the first interlayer dielectric layer to the source/drain feature;
an air gap disposed between the gate stack and the contact feature, the air gap extending from the source/drain feature to a second height above the substrate that is different than the first height of the gate stack, the source/drain feature being exposed to the air gap; and
a nitride layer disposed directly on and extending along a sidewall of the contact feature, the nitride layer having a bottom surface facing the substrate and wherein the bottom surface of the nitride layer is exposed to the air gap.

9. The device of claim 8, wherein the second height is greater than the first height.

10. The device of claim 8, further comprising a seal layer disposed directly on the first interlayer dielectric layer and the nitride layer, the seal layer sealing the air gap defined by the nitride layer, the seal layer, the first interlayer dielectric layer and the source/drain feature, wherein the nitride layer, the seal layer and the first interlayer dielectric layer are exposed to the air gap.

11. The device of claim 10, wherein the seal layer includes a first portion on a first side of the contact feature and a second portion on a second side of the contact feature,
wherein the first portion of the seal layer extends closer to the substrate than the second portion of the seal layer, and
wherein the first portion and the second portion of the seal layer are exposed to the air gap.

12. The device of claim 11, wherein the first portion of the seal layer is wider than the second portion of the seal layer.

13. The device of claim 8, wherein the source/drain feature includes a silicide feature that is exposed to the air gap.

14. The device of claim 13, wherein the source/drain feature further includes a doped region that is exposed to the air gap, the doped region being different than the silicide feature.

15. The device of claim 8, wherein the nitride layer includes a carbon-doped SiN material.

16. A device comprising:
a source/drain feature disposed on a substrate;
a first gate stack disposed on the substrate and associated with the source/drain feature, wherein the first gate stack includes a conductive layer and a sidewall spacer;
a second gate stack disposed on the substrate and associated with the source/drain feature;
a contact plug disposed on the source/drain feature and electrically coupled to the source/drain feature, wherein the contact plug is positioned closer to the first gate stack than the second gate stack; and
an air gap including a first portion disposed between the contact plug and the first gate stack, wherein the source/drain feature, the sidewall spacer and the conductive layer are exposed to the first portion of the air gap.

17. The device of claim 16, wherein the air gap further includes a second portion disposed between the contact plug and the second gate stack, and
wherein no portion of the second gate stack is exposed to the second portion of the air gap.

18. The device of claim 17, further comprising a nitride layer disposed directly on the contact plug, wherein the nitride layer is exposed to the first and second portions of the air gap.

19. The device of claim 17, wherein the source/drain feature is exposed to the second portion of the air gap.

20. The device of claim 16, further comprising:
an etch stop layer disposed directly on the first gate stack; and
an interlayer dielectric layer disposed on the etch stop layer, and
wherein the etch stop layer and the interlayer dielectric layer are exposed to the first portion of the air gap.

* * * * *